US 7,847,647 B2

(12) United States Patent
Martin et al.

(10) Patent No.: US 7,847,647 B2
(45) Date of Patent: Dec. 7, 2010

(54) OSCILLATOR CIRCUIT WITH ACOUSTIC SINGLE-PORT SURFACE WAVE RESONATORS

(75) Inventors: Guenter Martin, Dresden (DE); Bert Wall, Potsdam (DE)

(73) Assignee: Vectron International GmbH & Co. KG, Teltow (DE)

(*) Notice: Subject to any disclaimer, the term of this patent is extended or adjusted under 35 U.S.C. 154(b) by 51 days.

(21) Appl. No.: 12/227,953

(22) PCT Filed: Jun. 7, 2007

(86) PCT No.: PCT/EP2007/005205
§ 371 (c)(1),
(2), (4) Date: Feb. 25, 2009

(87) PCT Pub. No.: WO2007/141049
PCT Pub. Date: Dec. 13, 2007

(65) Prior Publication Data
US 2009/0160567 A1    Jun. 25, 2009

(30) Foreign Application Priority Data
Jun. 8, 2006    (DE) ........................ 10 2006 027 060

(51) Int. Cl.
*H03B 5/32* (2006.01)
*H03H 9/02* (2006.01)
*H03H 9/25* (2006.01)

(52) U.S. Cl. .................................. 331/107 A; 331/176
(58) Field of Classification Search ................... 331/65, 331/66, 107 A, 158, 175, 176; 310/313 A, 310/315, 360; 333/193–195
See application file for complete search history.

(56) References Cited

U.S. PATENT DOCUMENTS
4,193,045 A    3/1980    Houkawa et al.
(Continued)

FOREIGN PATENT DOCUMENTS
DE    29 38 158    4/1980
(Continued)

OTHER PUBLICATIONS
Martin G et al: "Saw resonators for temperature stable oscillators" Ultrasonics Symposium, 2005, IEEE Rotterdam, The Netherlands Sep. 12-21, 2005, Piscataway, NJ, USA, IEEE, Sep. 18, 2005, pp. 446-449, XP010899003 ISBN: 0-7803-9382-1 the whole document.
(Continued)

Primary Examiner—David Mis
(74) Attorney, Agent, or Firm—Jordan and Hamburg LLP

(57) ABSTRACT

An oscillator circuit includes a combination of two frequency-determining elements, designed as single-port surface wave resonators with interdigital converters, and one active electronic circuit. The two single-port surface wave resonators are connected to each other, avoiding inductive components. In the case of a combination in a parallel circuit, the connection is designed as a combination oscillating at high-frequency anti-resonance, and in the case of a combination in a series circuit, the combination is designed as a combination oscillating at high-frequency resonance. A ratio of apertures of the interdigital converters to one another, a ratio of their number of prongs to one another, and the thickness of the electrode layer of the single-port surface wave resonators as well as the propagation direction for acoustic surface waves of the single-port surface wave resonators are selected so that the temperature-dependent change of the phase of the combination and the temperature-dependent change of the total phase of the rest of the elements of the oscillator circuit have signs opposite to one another and that the sum of these phase changes in a thermal operating range of the oscillator circuit is smaller than a value of the phase change of the combination and smaller than a value of the phase change of the rest of the elements of the oscillator circuit.

7 Claims, 1 Drawing Sheet

U.S. PATENT DOCUMENTS

| | | | |
|---|---|---|---|
| 4,272,742 A | 6/1981 | Lewis | |
| 7,511,587 B2 * | 3/2009 | Martin | 331/107 A |
| 2005/0122179 A1 | 6/2005 | Ogiso | |
| 2006/0109064 A1 | 5/2006 | Toncich et al. | |

FOREIGN PATENT DOCUMENTS

| DE | 10 2005 060 924.4 | 7/2007 |
|---|---|---|

OTHER PUBLICATIONS

Database Inspec [Online] The Institution of Electrical Engineers, Stevenage, GB; 2006, Martin G et al: "Temperature stable one-port SAW resonators" XP 002459202 Database accession No. 9474369 abstract & 2006 IEEE Ultrasonics Symposium Oct. 3-6, 2006 Vancouver, BC, Canada, Oct. 3, 2006 p. 4 pp., 2006 IEEE Ultrasonics Symposium (IEEE Cat. No. 06CH37777) IEEE Piscataway, NJ, USA.

* cited by examiner

OSCILLATOR CIRCUIT WITH ACOUSTIC SINGLE-PORT SURFACE WAVE RESONATORS

BACKGROUND

1. Technical Field

The invention belongs to the field of electrical engineering/electronics and relates to an oscillator circuit, including a combination comprising two frequency-determining elements and an active electronic circuit, the frequency-determining elements being configured as one-port surface wave resonators having interdigital transducers.

Objects for which the application of the invention is possible and advantageous include components based on surface acoustic waves, such as oscillators and sensors, and particularly sensors for which the oscillator frequency temperature response can be adjusted.

2. State of the Art

Oscillator circuits are known, which include a combination comprising two parallel or series connected frequency-determining elements and an active electronic circuit having negative incremental resistance, or negative incremental conductance, wherein the frequency-determining elements are configured as one-port surface wave resonators having interdigital transducers, the synchronous frequency first-order temperature coefficients of the two one-port surface wave resonators having different algebraic signs, while the synchronous frequency second-order temperature coefficients of the two one-port surface wave resonators have the same algebraic signs.

In a particular configuration, the combination comprising two frequency-determining elements comprises two one-port surface wave resonators, the substrates of which are part of one and the same crystal section, but which use different propagation directions (DE 29 38 158 A1). The transducers of the one-port surface wave resonators are connected in parallel. The crystal section used is ST cut quartz. The substrate of the main resonator uses the X axis of quartz as the direction of propagation, while the propagation direction of the auxiliary resonator is aligned at 41° relative thereto. Accordingly, the first order temperature coefficient of the synchronous frequency is eliminated for the main resonator. In contrast, the first order temperature coefficient of the synchronous frequency of the auxiliary resonator is other than zero, Despite the different orders of the temperature coefficients, it is possible to achieve compensation of the second order temperature coefficient of the synchronous frequency of the main resonator. The first order temperature coefficient of the synchronous frequency of the auxiliary resonator required for the compensation of the second order temperature coefficient of the synchronous frequency of the main resonator is stated as a function of the second-order temperature coefficient to be compensated, the amplitude of the auxiliary resonator, and the propagation distance, which is equal for both resonators. This solution discloses no suggestion of an oscillator circuit for one- port surface wave resonators. However, it be assumed that the manner in which an oscillator circuit comprising one-port surface wave resonators can be configured is known.

A known solution in connection with remotely queried sensors is to combine two one-port surface wave resonators for temperature compensation, wherein the substrates of these resonators present different propagation directions of one and the same crystal section (*A differential measurement SAW device for passive remote sensoring*, W. Buff, M. Rusko, T. Vandahl, M. Goroll, and F. M ler, Proc. 1996 IEEE Ultrasonics Symposium, pgs. 343-346 [3]). It is a prerequisite for temperature compensation that these propagation directions have different phase velocities and nearly identical synchronous frequency temperature coefficients.

A previously proposed particular configuration for an oscillator circuit includes a combination comprising two frequency-determining elements and an active electronic circuit, the frequency-determining elements being configured as one-port surface wave resonators having interdigital transducers. The substrates of the one-port surface wave resonators are part of one and the same crystal section, but have different propagation directions (DE 10 2005 060 924.4). An inductance is connected in parallel with the transducer of each one-port surface wave resonator. Two circuits of this type are connected in series, the one-port surface wave resonators present in these circuits differing in the propagation directions thereof. The synchronous frequency first-order temperature coefficients of the two one-port surface wave resonators differ with respect to their algebraic signs. By suitably selecting the inductors and apertures of the one-port surface wave resonators, it is possible to compensate both the first-order and the second-order oscillator frequency temperature coefficients.

The proposed solution has the disadvantage that, at undesirable frequencies, the inductances present in the oscillator circuit can result in oscillation states for the oscillator, which are not stabilized by the one-port surface wave resonators with respect to the temperature sensitivity thereof.

SUMMARY OF THE INVENTION

The invention is directed at modifying oscillator circuits of the known type, comprising acoustic one-port surface wave resonators as frequency-determining elements, so that both the first-order and the second-order temperature coefficients of the oscillator frequency can be compensated without the use of inductors.

The invention is based on an oscillator circuit, which includes a combination comprising two parallel or series connected frequency-determining elements and an active electronic circuit having negative incremental resistance, or negative incremental conductance, wherein the frequency-determining elements are configured as one-port surface wave resonators having interdigital transducers, and the first-order temperature coefficients of the synchronous frequency of the two one-port surface wave resonators have different algebraic signs, and the second-order temperature coefficients of the synchronous frequency of the two one-port surface wave resonators have the same algebraic sign.

With an oscillator circuit of this type, the aforementioned objected is achieved in that:

a) the two one-port surface wave resonators (12, 13) are connected to each other without using inductive components, wherein aa) if a combination comprising parallel connected two frequency-determining elements (12, 13) is present, the combination is configured as a combination oscillating at the high-frequency antiresonance, and ab) if a combination comprising two series connected frequency-determining elements (12, 13) is present, the combination is configured as a combination oscillating at the high-frequency resonance.

In addition, b) the ratio of the aperture (124, 134) and/or the ratio of the number of teeth in the transducer (123, 133) in the one-port surface wave resonator (12, 13) having the negative algebraic sign for the first-order temperature coefficient of the synchronous frequency to the aperture (124, 134) and/or of the number of teeth in the transducer (123, 133) in the one-port surface wave resonator (2, 3) having the positive algebraic sign for the first-order temperature coefficient of the synchronous frequency;

ba) is selected so as to be less than when ignoring the temperature response of the remaining elements of the oscillator circuit, if, in the case of a combination of two series connected frequency-determining elements (12, 13), the first-order temperature coefficient of the oscillator frequency is increased due to the influence of the remaining elements of the oscillator circuit, and bb) is selected so as to be greater than when ignoring the temperature response of the remaining elements of the oscillator circuit, if, in the case of a combination of two series connected frequency-determining elements (12, 13), the first-order temperature coefficient of the oscillator frequency is reduced due to the influence of the remaining elements of the oscillator circuit, and bc) is selected so as to be greater than when ignoring the temperature response of the remaining elements of the oscillator circuit, if, in the case of a combination of two parallel connected frequency-determining elements (12, 13), the first-order temperature coefficient of the oscillator frequency is increased due to the influence of the remaining elements of the oscillator circuit, and bd) is selected so as to be less than when ignoring the temperature response of the remaining elements of the oscillator circuit, if, in the case of a combination of two parallel connected frequency-determining elements (12, 13), the first-order temperature coefficient of the oscillator frequency is reduced due to the influence of the remaining elements of the oscillator circuit.

Piezoelectric one-port resonators, which also include one-port resonators that are based on surface acoustic waves on piezoelectric substrates, have two resonance states, that is to say resonance and antiresonance. The difference between these resonance types is described below. Piezoelectric one-port resonators are operated by an equivalent circuit, comprising a series oscillating circuit and a static capacitance connected in parallel thereto (shunt capacitor). Resonance is provided by the resonance of the series oscillating circuit, this resonance being determined by the elimination of the reactance of the series oscillating circuit. For this reason, the resonance is also referred to as the series resonance of the one-port resonator. Consequently, the impedance of the one-port resonator reaches a minimum at the resonance. In contrast, the sum of the reactance of the series oscillating circuit and the reactance of the shunt capacitor is eliminated at the antiresonance, which is to say that the capacitance contributing to the antiresonance is the series connected capacitances of the series oscillating circuit and the shunt capacitor, and is therefore less than the capacitance of the series oscillating circuit alone. Hence, the antiresonance frequency is always greater than the resonance frequency. Because the shunt capacitor is included in the resonant behavior, the antiresonance is also referred to as the parallel resonance of the one-port resonator. The impedance of the one-port resonator reaches a maximum at the antiresonance.

Advantageously, the invention can be configured as follows:

If a combination of two parallel connected frequency-determining elements is present, the magnitude of the negative incremental resistance of the active electronic circuit at the high-frequency antiresonance of the combination is selected so as to be greater than the ohmic resistance of the combination. Alternatively, if the combination is parallel connected, the degree of the negative incremental conductance of the active electronic circuit at the high-frequency antiresonance of the combination can be selected so as to be greater than the real conductance value of the combination.

If a combination of two series connected frequency-determining elements is present, the magnitude of the negative incremental resistance of the active electronic circuit at the high-frequency resonance of the combination is selected so as to be greater than the ohmic resistance of the combination. Alternatively, if the combination is series connected, the magnitude of the negative incremental conductance of the active electronic circuit at the high-frequency antiresonance of the combination can be selected so as to be greater than the real conductance value of the combination.

In order to fine tune the oscillator frequency temperature response, it is advantageous to connect a capacitance in parallel, in addition to the parallel connection of two one-port surface wave resonators. To this end, in each branch of the parallel connection a capacitance may be inserted in series with the respective one-port surface wave resonator.

Both one-port surface wave resonators can be composed of substrates of the same type of crystal, wherein the substrates of the one-port surface wave resonators can be composed of different crystal sections of the same type of crystal. It is particularly advantageous to provide the one-port surface wave resonators with different propagation directions for surface acoustic waves on one and the same crystal section. However, the substrates of the one-port surface wave resonators can also be of different types of crystal.

The one-port surface wave resonators can be disposed on separate substrates, or on a common substrate.

The interdigital transducers and the coupling elements can be associated with reflector strips.

The active electronic circuit can be a circuit having a negative incremental resistance, or an amplifier, wherein the combination comprising two frequency-determining elements is connected in feedback with the amplifier, in series or parallel, to the input and output of the amplifier, if the combination comprising the frequency-determining elements is series or parallel connected one-port surface wave resonators. It is particularly advantageous if the first-order temperature coefficient of the synchronous frequency of each of the two one-port surface wave resonators is other than zero and differs from the temperature coefficient of the other respective one-port surface wave resonator in terms of the algebraic sign. This is true, for example, if the crystal section is an ST cut quartz, and the direction perpendicular to the teeth of the transducers and to the reflector strips for the one one-port surface wave resonator is aligned at an angle of between 0° and 45° and, for the other one-port surface wave resonator, is aligned at an angle of greater than 45°, with respect to the crystallographic X axis of quartz.

The tooth periods and apertures of the transducers, as well as the thickness of the electrode layer of the one-port surface wave resonators should be selected so that the resonances thereof have a predetermined frequency separation at a predetermined temperature.

The invention will be described in further detail below on the basis of an embodiment. The embodiment relates to a combination comprising two parallel connected frequency-determining elements for a temperature-compensated oscillator.

DETAILED DESCRIPTION

Figure 1:
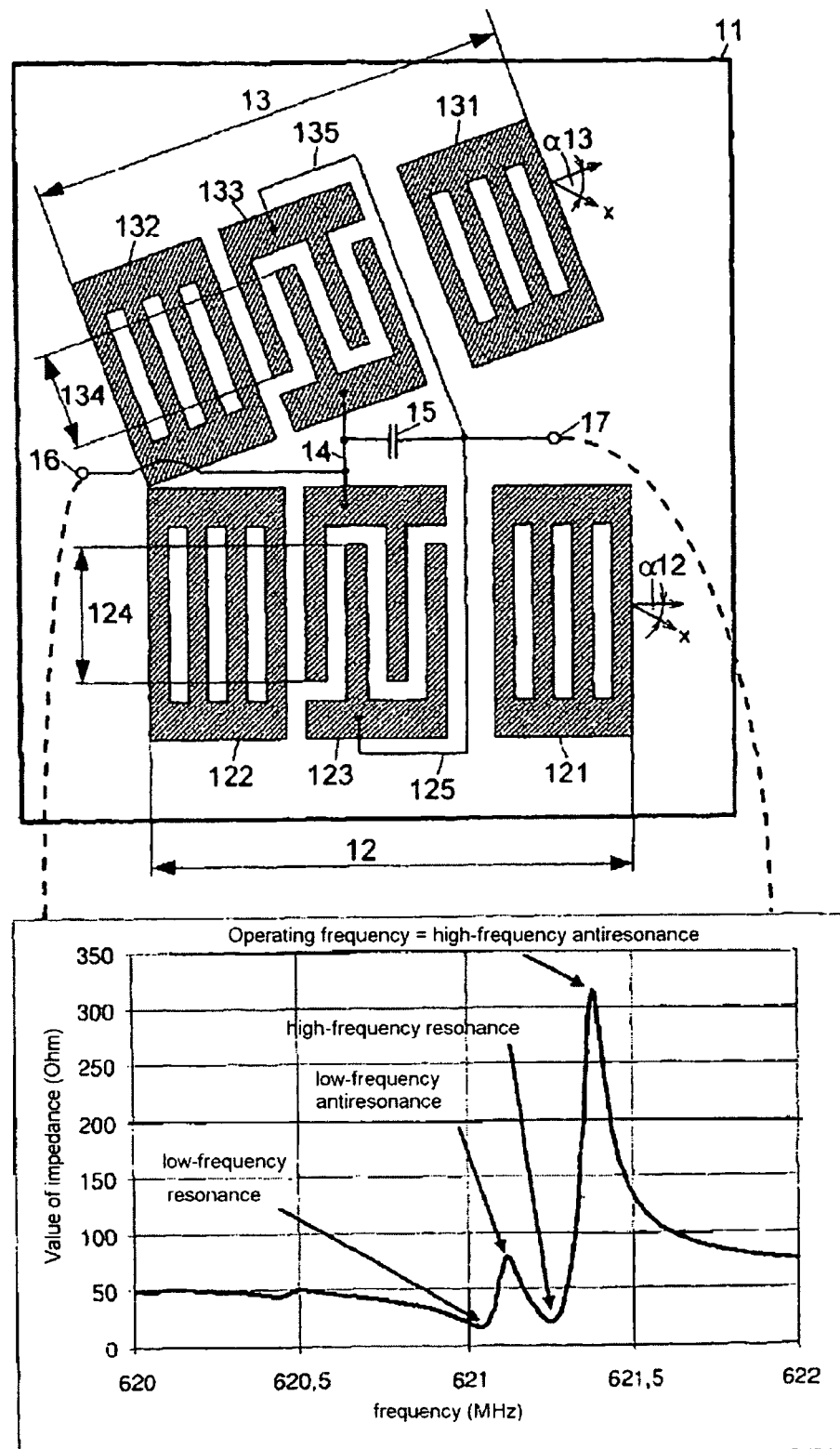
FIG. 1 in the accompanying drawing shows a circuit diagram for combination of two parallel connected frequency-determining elements for a temperature-compensated oscillator, and in an accompanying graph showing a magnitude of impedance as a function of frequency.

Referring to FIG. 1, a circuit diagram show that two one-port surface wave resonators 12, 13 are disposed on a substrate 11, which is an ST cut quartz. The resonators 12, 13 comprise reflectors 121, 122 and an interdigital transducer 123, or comprise reflectors 131, 132 and an interdigital transducer 133. Apertures 124, 134 of the transducers 123, 133 are different from each other. A direction perpendicular to teeth of the transducer 123 and the reflector strips 121, 122 is inclined by the angle $\alpha_{12}$ relative to the crystallographic X axis, with $\alpha_{12}$ being between 40° and 45°. A direction perpendicular to teeth of the transducer 133 and the reflectors strips 131, 132 is inclined by the angle $\alpha_{13}$ relative to the crystallographic X axis, with $\alpha_{13}$ being greater than 45° and less than 50°. The directions denoted by the angles $\alpha_{12}$ and $\alpha_{13}$ have a first order temperature coefficient of a synchronous frequency that is greater or less than zero, while second order temperature coefficients of the synchronous frequency have the same algebraic signs in both directions. The transducers 123, 133 are connected to each other via connections 125, 135 and 14 and are connected in parallel with a capacitance 15. The resonator formed by the one-port surface wave resonators 12, 13 and the capacitance 15 is a two-terminal network, with connections 16, 17 constituting the two terminals thereof, by which the resonator is inserted in an oscillator circuit.

A magnitude of impedance of the parallel connected one-port surface wave resonators 12, 13 and the capacitance 15, measurable across the connections 16, 17, is shown as a function of the frequency in a graph in FIG. 1, which is connected via dotted lines to the connections 16, 17. The graph shows a low-frequency and a high-frequency resonance and antiresonance. As a necessary prerequisite for compensation of both the first-order and the second-order temperature coefficients of the oscillator frequency, the oscillator in question is operated at the high-frequency antiresonance. Under these conditions, it is possible to compensate both the first order temperature coefficient and the second order temperature coefficient of the oscillator frequency by adjusting the ratios of the apertures 124 and 134 and the number of teeth of the transducers 123, 133 and the capacitance 15.

The invention claimed is:
1. An oscillator circuit configured to oscillate at a oscillating frequency, comprising:
   two frequency-determining elements provided in a combination with each other wherein the two frequency-determining elements are arrange in one of a series connection or a parallel connection;
   an active electronic circuit having one of negative incremental resistance, or negative incremental conductance;
   the two frequency-determining elements being two one-port surface wave resonators each having an interdigital transducer, the two one-port surface wave resonators having synchronous frequency first-order temperature coefficients having different algebraic signs from one another, and synchronous frequency second-order temperature coefficients having the same algebraic signs, the oscillator circuit being further configured such that:
   a) the two one-port surface wave resonators are connected to each other without using inductive components, wherein:
      aa) if the combination comprising the two frequency-determining elements is arranged in the parallel connection, the combination is configured as a combination oscillating at a high-frequency antiresonance as the oscillation frequency, and
      ab) if the combination comprising two frequency-determining elements is arranged in the series connection, the combination is configured as a combination oscillating at a high-frequency resonance as the oscillation frequency, and
   b) a ratio of at least one of:
      an aperture or a number of teeth of the interdigital transducer in the one-port surface wave resonator having a negative algebraic sign for the first-order temperature coefficient of a synchronous frequency thereof,
   to a respective at least one of:
      an aperture or a number of teeth of the interdigital transducer in the one-port surface wave resonator having a positive algebraic sign for the first-order temperature coefficient of a synchronous frequency thereof,
   is selected:
      ba) to be less than a ratio of a corresponding one of the apertures or the number of teeth when, ignoring a temperature response of remaining elements of the oscillator circuit, if, in a case of the combination of two series connected frequency-determining elements, the first-order temperature coefficient of the oscillator frequency is increased due to influence of the remaining elements of the oscillator circuit, and
      bb) to be greater than a ratio of a corresponding one of the apertures or the number of teeth when, ignoring the temperature response of the remaining elements of the oscillator circuit, if, in a case of the combination of two series connected frequency-determining elements, the first-order temperature coefficient of the oscillator frequency is reduced due to the influence of the remaining elements of the oscillator circuit, and
      bc) to be greater than a ratio of a corresponding one of the apertures or the number of teeth when, ignoring the temperature response of the remaining elements of the oscillator circuit, if, in a case of a combination of two parallel connected frequency-determining elements, the first-order temperature coefficient of the oscillator frequency is increased due to the influence of the remaining elements of the oscillator circuit, and
      bd) to be less than a ratio of a corresponding one of the apertures or the number of teeth when, ignoring the temperature response of the remaining elements of the oscillator circuit, if, in a case of a combination of two parallel connected frequency-determining elements, the first-order temperature coefficient of the oscillator frequency is reduced due to the influence of the remaining elements of the oscillator circuit.

2. The oscillator circuit according to claim 1, wherein if the parallel connection of the two frequency-determining elements is present, a magnitude of the negative incremental resistance of the active electronic circuit at the high-frequency antiresonance of the combination is selected so as to be greater than an ohmic resistance of the combination, or a magnitude of the negative incremental conductance of the active electronic circuit at the high-frequency antiresonance of the combination is selected so as to be greater than a real conductance value of the combination.

3. The oscillator circuit according to claim 1, wherein, if the series connection of the two frequency-determining elements is present, a magnitude of the negative incremental resistance of the active electronic circuit at the high-frequency resonance of the combination is selected so as to be greater than an ohmic resistance of the combination, or a magnitude of the negative incremental conductance of the active electronic circuit at the high-frequency resonance of the combination is selected so as to be greater than the real conductance value of the combination.

4. The oscillator circuit according to claim 1, wherein the two one-port surface wave resonators are arranged in the parallel connection and a capacitance is connected in parallel with the two one-port surface wave resonators.

5. The oscillator circuit according to claim 1, wherein the two one-port surface wave resonators are arranged in the parallel connection and in each branch of the parallel connection a capacitance is inserted in series with the respective one-port surface wave resonator.

6. The oscillator circuit according to claim 1, wherein the two one-port surface wave resonators comprise substrates of a same type of crystal, or substrates of different types of crystal.

7. The oscillator circuit according to claim 1, wherein the two one-port surface wave resonators are disposed on separate substrates, or on a common substrate.

* * * * *